United States Patent
Han

(10) Patent No.: US 9,163,306 B2
(45) Date of Patent: Oct. 20, 2015

(54) PATTERNING SLIT SHEET FRAME ASSEMBLY

(71) Applicant: Jeong-Won Han, Yongin (KR)

(72) Inventor: Jeong-Won Han, Yongin (KR)

(73) Assignee: SAMSUNG DISPLAY CO., LTD., Yongin, Gyunggi-Do (KR)

(*) Notice: Subject to any disclaimer, the term of this patent is extended or adjusted under 35 U.S.C. 154(b) by 210 days.

(21) Appl. No.: 13/834,721

(22) Filed: Mar. 15, 2013

(65) Prior Publication Data

US 2014/0130733 A1    May 15, 2014

(30) Foreign Application Priority Data

Nov. 14, 2012 (KR) .................. 10-2012-0129102

(51) Int. Cl.
    B05C 21/00  (2006.01)
    H01L 51/56  (2006.01)
    H01L 27/00  (2006.01)
    C23C 14/04  (2006.01)
    H01L 27/12  (2006.01)

(52) U.S. Cl.
    CPC .............. *C23C 14/042* (2013.01); *B05C 21/005* (2013.01); *H01L 27/124* (2013.01); *H01L 27/1259* (2013.01); *H01L 51/56* (2013.01)

(58) Field of Classification Search
    None
    See application file for complete search history.

(56) References Cited

U.S. PATENT DOCUMENTS

| 6,858,086 | B2 | 2/2005 | Kang |
| 2003/0221613 | A1 | 12/2003 | Kang et al. |
| 2003/0221614 | A1 | 12/2003 | Kang et al. |
| 2004/0104197 | A1 | 6/2004 | Shigemura et al. |
| 2006/0012290 | A1 | 1/2006 | Kang |
| 2009/0127236 | A1 | 5/2009 | Hong et al. |
| 2009/0260566 | A1* | 10/2009 | Landgraf et al. ............. 118/504 |
| 2011/0185561 | A1* | 8/2011 | Landgraf et al. ............. 29/446 |
| 2011/0265714 | A1 | 11/2011 | Lee et al. |

FOREIGN PATENT DOCUMENTS

| KR | 10-2006-0055939 A | 5/2006 |
| KR | 10-2007-0062789 A | 6/2007 |
| KR | 10-2009-0052203 | 5/2009 |

* cited by examiner

*Primary Examiner* — Dah-Wei D Yuan
*Assistant Examiner* — Jethro M Pence
(74) *Attorney, Agent, or Firm* — Lee & Morse, P.C.

(57) ABSTRACT

A patterning slit sheet frame assembly includes a patterning slit sheet having a pattern, a patterning slit sheet frame supporting the patterning slit sheet, and a tensile force application unit that applies a tensile force to the patterning slit sheet after the patterning slit sheet is disposed on the patterning slit sheet frame.

19 Claims, 7 Drawing Sheets

PATTERNING SLIT SHEET FRAME ASSEMBLY

CROSS-REFERENCE TO RELATED PATENT APPLICATION

This application claims priority under 35 U.S.C. §119 to Korean Patent Application No. 10-2012-0129102, filed on Nov. 14, 2012, in the Korean Intellectual Property Office, the disclosure of which is incorporated herein in its entirety by reference.

BACKGROUND

Organic light emitting display apparatuses, from among display apparatuses, may have wide viewing angles, excellent contrasts, and quick response speeds.

SUMMARY

Embodiments may be realized by providing a patterning slit sheet frame assembly that includes a patterning slit sheet having a pattern, a patterning slit sheet frame supporting the patterning slit sheet, and a tensile force application unit that applies a tensile force to the patterning slit sheet after the patterning slit sheet is disposed on the patterning slit sheet frame.

The patterning slit sheet may include a center portion where a patterning slit is formed and an outer portion where a pattern is not formed. The patterning slit sheet may be disposed on the patterning slit sheet frame as the outer portion is welded to the patterning slit sheet frame. The tensile force application unit may be disposed on an inner side of the patterning slit sheet frame.

The tensile force application unit may be disposed closer to the center portion than a location where the patterning slit sheet and the patterning slit sheet frame are welded. The tensile force application unit may contact the outer portion to surround the center portion of the patterning slit sheet. The tensile force application unit may move towards a top of the patterning slit sheet to apply the tensile force to the patterning slit sheet while the patterning slit sheet and the pattering slit sheet frame are connected to each other.

The patterning slit sheet frame may have a pillar shape having a penetrating portion corresponding to the center portion. A top surface of the patterning slit sheet frame may be combined connected to the outer portion, and the center portion may be exposed by the penetrating portion. The tensile force application unit may be disposed on an inner surface of the patterning slit sheet frame such that a top surface of the tensile force application unit contacts the outer portion.

The tensile force application unit may ascend or descend along the inner surface of the patterning slit sheet frame. The tensile force application unit may apply the tensile force to the patterning slit sheet by ascending along the inner surface of the patterning slit sheet frame.

There may be n tensile force application units, where n is a natural number, wherein the (n)th tensile force application unit may be disposed on an inner surface of the (n−1)th tensile force application unit. The patterning slit sheet frame may include an accommodation groove so as to accommodate the tensile force application unit therein.

The tensile force application unit may be disposed inside the accommodation groove and the accommodation groove may be covered by the outer portion. The tensile force application unit may ascend or descend inside the accommodation groove, and the tensile force may be applied to tighten the patterning slit sheet as the tensile force application unit ascends and protrudes outside the accommodation groove.

There may be a plurality of the accommodation grooves and the tensile force application unit may be disposed in each of the plurality of accommodation grooves. The plurality of accommodation grooves may be spaced apart from each other in a receding direction from a center point of the patterning slit sheet.

There may be a plurality of the tensile force application units, and each of the plurality of tensile force application units may include an accommodation portion for accommodating the other tensile force application unit. The tensile force application unit may be formed separately on the inner surface of the patterning slit sheet frame.

There may be n tensile force application units, wherein n is a natural number, wherein the first tensile force application unit may be accommodated in the accommodation groove, the second tensile force application unit may be accommodated in the accommodation portion of the first tensile force application unit, and the (n)th tensile force application unit may be accommodated in the accommodation portion of the (n−1)th tensile force application unit.

BRIEF DESCRIPTION OF THE DRAWINGS

Features will become more apparent by describing in detail exemplary embodiments thereof with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

Figure 1:
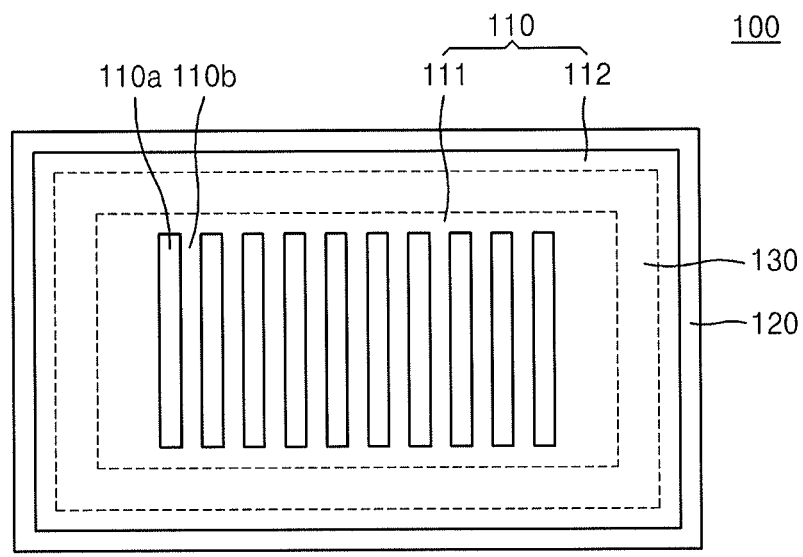
FIG. 1 is a plan view schematically illustrating a patterning slit sheet frame assembly according to an embodiment.
Figure 2:
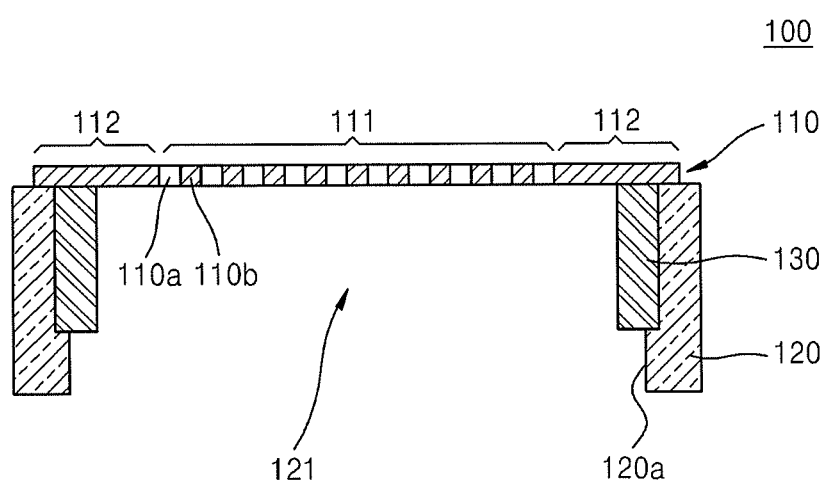
FIG. 2 is a cross-sectional view schematically illustrating the patterning slit sheet frame assembly of FIG. 1.

FIG. 1 is a plan view schematically illustrating a patterning slit sheet frame assembly 100 according to an embodiment, and FIG. 2 is a cross-sectional view schematically illustrating the patterning slit sheet frame assembly 100 of FIG. 1.

Referring to FIGS. 1 and 2, the patterning slit sheet frame assembly 100 may include a patterning slit sheet 110, a patterning slit sheet frame 120, and a tensile force application unit 130.

The patterning slit sheet 110 may include a center portion 111 and an outer portion 112.

The center portion 111 may include a plurality of patterning slits 110a and a patterning rib 110b. The patterning slit 110a is an opening penetrating through the patterning slit sheet 110. A deposition material passes through the patterning slit 110a and is deposited on a deposition target, e.g., on a substrate (not shown). A shape of a thin film deposited on the deposition target is determined based on a shape of the patterning slit 110a. For example, as shown in FIG. 1, when the patterning slit 110a is rectangular, the thin film deposited on the deposition target may also be rectangular like the patterning slit 110a. The patterning slit 110a may have any one of various shapes including a rectangle.

The patterning rib 110b is arranged between adjacent ones of patterning slits 110a and can be regarded as a remainder of the patterning slit sheet 110 after forming the patterning slit 110a therein. The patterning rib 110b blocks the deposition material discharged from a deposition source, thereby reducing the possibility of and/or preventing the deposition material from being deposited on undesired regions of the deposition target.

The outer portion 112 patterning slit sheet 110 is a portion surrounding the center portion 111. The patterning slits are not formed in the outer portion 112 so as to be excluded from the outer portion 112. The outer portion 112 contacts, e.g., is directly attached to, the patterning slit sheet frame 120 and is fixed to the patterning slit sheet frame 120. The outer portion 112 also contacts the tensile force application unit 130 and is configured to receive, e.g., directly receives, a tensile force by the tensile force application unit 130, as will be described below.

The patterning slit sheet frame 120 supports and fixes the patterning slit sheet 110. The patterning slit sheet frame 120 includes a penetrating portion 121 for exposing the center portion 111 of the patterning slit sheet 110. The outer portion 112 of the patterning slit sheet 110 is disposed on and fixed to a top surface of the patterning slit sheet frame 120. The patterning slit sheet frame 120 may have an approximate window frame shape, e.g., so as to include an outer frame that surrounds an interior opening that exposes the plurality of patterning slits 110a. The patterning slit sheet frame 120 may be fixed to the patterning slit sheet 110 via welding. For example, when the patterning slit sheet 110 is fixed to the patterning slit sheet frame 120 via welding, the tensile force is applied to the patterning slit sheet 110 while welding and fixing the patterning slit sheet 110 to the patterning slit sheet frame 120 so that the patterning slit sheet 110 does not droop (or such that drooping is minimized) and is tightened.

The tensile force application unit 130 is disposed on an inner surface 120a of the patterning slit sheet frame 120, and a top surface of the tensile force application unit 130 contacts the outer portion 112 of the patterning slit sheet 110. The tensile force application unit 130 contacts the outer portion 112 to surround the center portion 111, while exposing the center portion 111 through the penetrating portion 121. Unlike the patterning slit sheet frame 120, the tensile force application unit 130 is not connected to the patterning slit sheet 110 via welding. For example, the tensile force application unit 130 may directly contact the patterning slit sheet 110 without being affixed to the patterning slit sheet 110.

The tensile force application unit 130 may ascend or descend along the inner surface 120a of the patterning slit sheet frame 120. As the tensile force application unit 130 ascends along the inner surface 120a of the patterning slit sheet frame 120, the tensile force application unit 130 may provide the tensile force to the patterning slit sheet 110. For example, the tensile force application unit 130 may provide the tensile force to the patterning slit sheet 110 after the patterning slit sheet 110 is welded and fixed to the patterning slit sheet frame 120.

Figure 3:
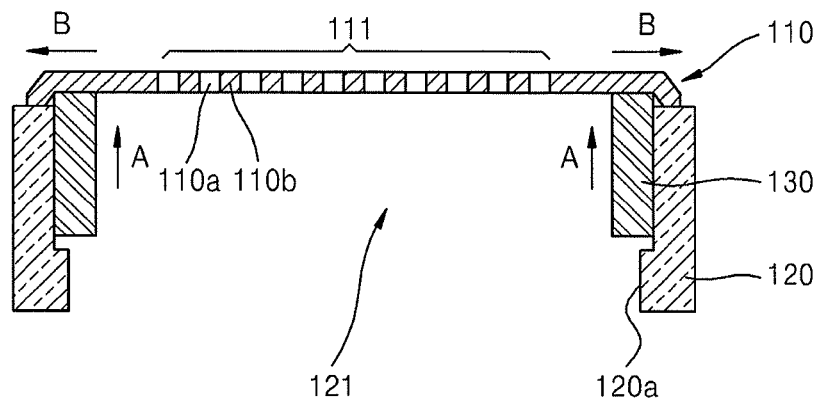
FIG. 3 is a cross-sectional view of a patterning slit sheet frame assembly wherein a tensile force is applied to a patterning slit sheet.

Referring to FIG. 3, the tensile force application unit 130 ascends (direction indicated by arrows A) along the inner surface 120a of the patterning slit sheet frame 120 to ascend the outer portion 112 of the patterning slit sheet 110. Since a periphery of the outer portion 112 of the patterning slit sheet 110 is welded and fixed to the top surface of the patterning slit sheet frame 120, when the tensile force application unit 130 ascends as described above, the outer portion 112 of the patterning slit sheet 110 ascends while the periphery of the outer portion 112 is fixed. Accordingly, the tensile force is applied to the patterning slit sheet 110 in a direction indicated by arrows B, thereby tightly maintaining the patterning slit sheet 110 and reducing the possibility of the patterning slit sheet 110 drooping due to self-weight.

According to a general mask and a general mask frame, a tensile force cannot be applied to the general mask after the general mask is drawn and fixed, and it may be difficult to apply tensile force while fixing the general mask to the general mask frame. Once the general mask is welded to the general mask frame, the general mask cannot be separated from the general mask frame, and thus a lot of time and high precision are used when initially fixing the general mask to the general mask frame. If the tensile force is incorrectly applied to the general mask, e.g., so that the general mask is crookedly welded to the general mask frame, the general mask and the general mask frame are discarded. Further, the general mask tends to droop downward due to self-weight as a deposition process continues, and thus sizes of opening portions formed on the general mask become non-uniform and pixel position accuracy (PPA) is decreased.

However, according to the patterning slit sheet frame assembly 100 of the current embodiment, the tensile force may be applied to the patterning slit sheet 110 even after the patterning slit sheet 110 is welded and fixed to the patterning slit sheet frame 120. Accordingly, even when there is a slight problem while initially welding the patterning slit sheet 110 to the patterning slit sheet frame 120, the patterning slit sheet 110 may be further minutely tightened by additionally applying the tensile force to the patterning slit sheet 110 by using the tensile force application unit 130 after the welding has already been performed. Also, even when the patterning slit sheet 110 droops due to self-weight and continuous deposition processes, the patterning slit sheet 110 may be again tightened by applying the tensile force to the patterning slit sheet 110 by using the tensile force application unit 130.

Figure 4:
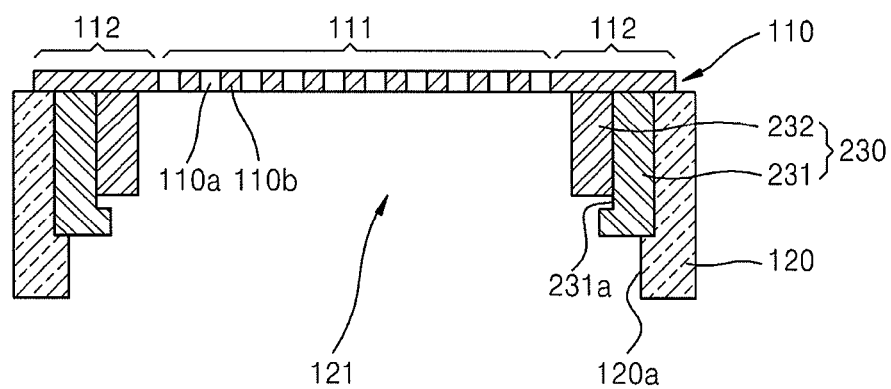
FIG. 4 is a cross-sectional view schematically illustrating a patterning slit sheet frame assembly according to an embodiment.

FIG. 4 is a cross-sectional view schematically illustrating a patterning slit sheet frame assembly 200 according to another embodiment.

Referring to FIG. 4, the patterning slit sheet frame assembly 200 according to the present embodiment is different from the patterning slit sheet frame assembly 100 of FIGS. 1 through 3 in that a tensile force application unit 230 includes a first tensile force application unit 231 and a second tensile force application unit 232. Descriptions of components that are the same as those of the patterning slit sheet frame assembly 100 will not be repeated as they have been described above with reference to FIGS. 1 through 3.

The tensile force application unit 230 includes the first tensile force application unit 231 and the second tensile force application unit 232. The first tensile force application unit 231 may be disposed on the inner surface 120a of the patterning slit sheet frame 120 and the second tensile force application unit 232 may be disposed on an inner surface 231a of the first tensile force application unit 231. The first tensile force application unit 231 may move up or down along the inner surface 120a of the patterning slit sheet frame 120, and the second tensile force application unit 232 may move up or down along the inner surface 231a of the first tensile force application unit 231. The first and second tensile force application units 231 and 232 may separately move. For example, the first tensile force application unit 231 may first ascend to apply a tensile force to the patterning slit sheet 110 and then the second tensile force application unit 232 may ascend to apply an additional tensile force to the patterning slit sheet 110.

Figure 5:
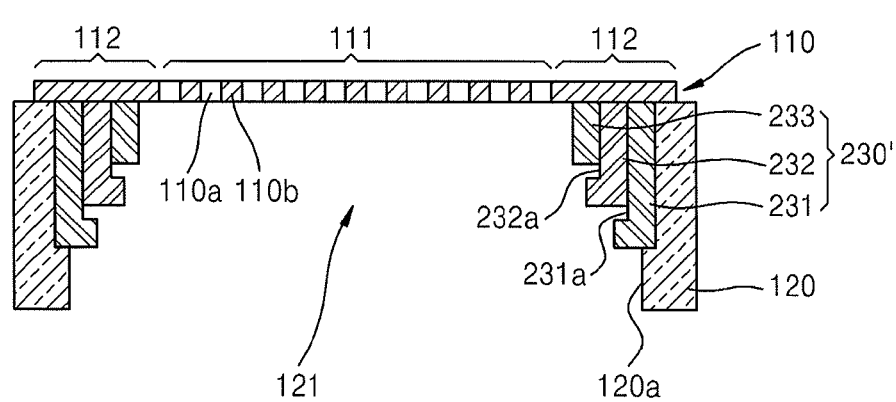
FIG. 5 is a cross-sectional view schematically illustrating a patterning slit sheet frame assembly according to an embodiment.

FIG. 5 is a cross-sectional view schematically illustrating a patterning slit sheet frame assembly 200' according to another embodiment.

Referring to FIG. 5, the patterning slit sheet frame assembly 200' according to the current embodiment is different from the patterning slit sheet frame assembly 100 of FIGS. 1 through 3 in that a tensile force application unit 230' includes the first tensile force application unit 231, the second tensile force application unit 232, and a third tensile force application unit 233. Descriptions of components that are the same as those of the patterning slit sheet frame assembly 100 will not be repeated as they have been described above with reference to FIGS. 1 through 3.

The tensile force application unit 230' includes the first tensile force application unit 231, the second tensile force application unit 232, and the third tensile force application unit 233. The first tensile force application unit 231 may be disposed on the inner surface 120a of the patterning slit sheet frame 120, the second tensile force application unit 232 may be disposed on the inner surface 231a of the first tensile force application unit 231, and the third tensile force application unit 233 may be disposed on an inner surface 232a of the second tensile force application unit 232.

The first tensile force application unit 231 may move up or down along the inner surface 120a of the patterning slit sheet frame 120, the second tensile force application unit 232 may move up or down along the inner surface 231a of the first tensile force application unit 231, and the third tensile force application unit 233 may move up or down along the inner surface 232a of the second tensile force application unit 232. The first through third tensile force application unit 231 through 233 may separately move. For example, the first tensile force application unit 231 may first ascend to apply a tensile force to the patterning slit sheet 110, the second tensile force application unit 232 may ascend next to apply an additional tensile force to the patterning slit sheet 110, and then the third tensile force application unit 233 may ascend to apply an additional tensile force to the patterning slit sheet 110.

The number of tensile force application units is not limited and may be n, where n is a natural number. In this case, an (n)th tensile force application unit may be disposed on an inner surface of an (n–1)th tensile force application unit.

Figure 6:
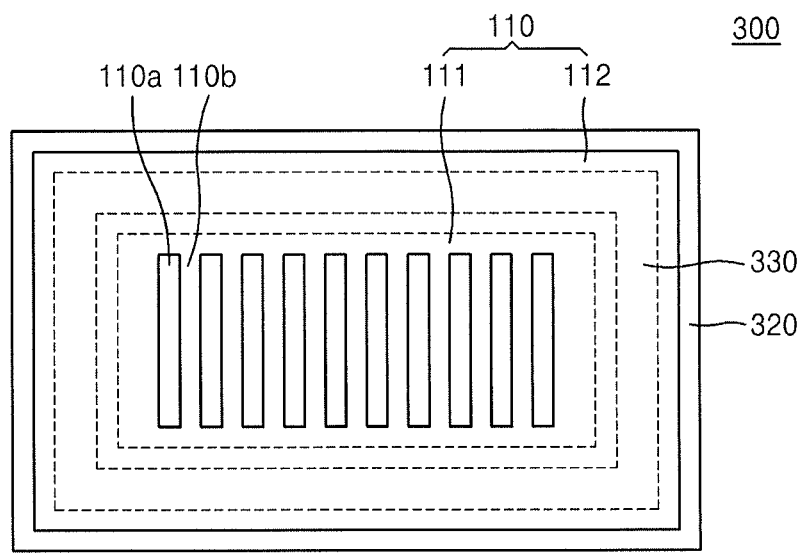
FIG. 6 is a plan view schematically illustrating a patterning slit sheet frame assembly according to an embodiment.
Figure 7:
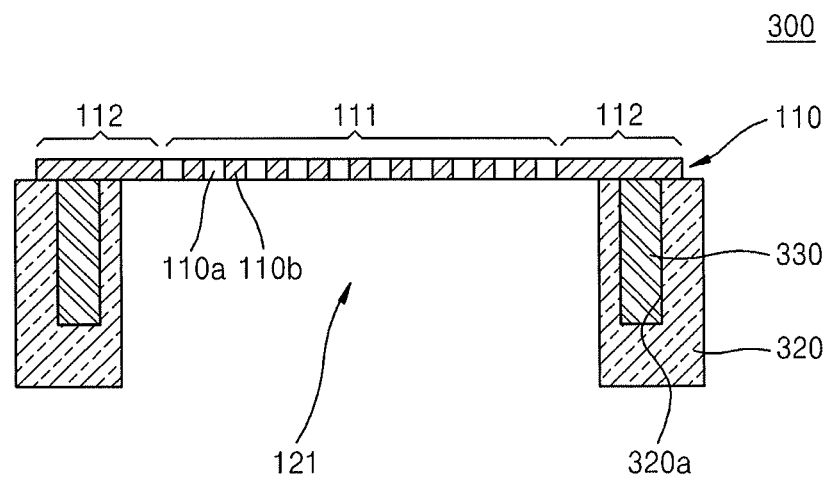
FIG. 7 is a cross-sectional view schematically illustrating the patterning slit sheet frame assembly of FIG. 6.
Figure 8:
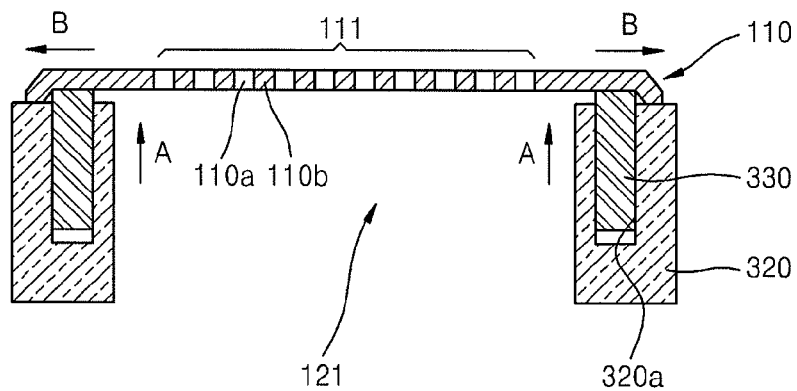
FIG. 8 is a cross-sectional view of a patterning slit sheet frame assembly wherein a tensile force is applied to a patterning slit sheet.

FIG. 6 is a plan view schematically illustrating a patterning slit sheet frame assembly 300 according to another embodiment, FIG. 7 is a cross-sectional view schematically illustrating the patterning slit sheet frame assembly 300 of FIG. 6, and FIG. 8 is a cross-sectional view of the patterning slit sheet frame assembly 300 in which a tensile force is applied to the patterning slit sheet 110.

The patterning slit sheet frame assembly 300 according to the current embodiment is different from the patterning slit sheet frame assembly 100 of FIGS. 1 through 3 in terms of a patterning slit sheet frame 320 and a tensile force application unit 330. Descriptions of components that are the same as those of the patterning slit sheet frame assembly 100 will not be repeated as they have been described above with reference to FIGS. 1 through 3.

Referring to FIGS. 6 and 7, the tensile force application unit 330 is disposed inside the patterning slit sheet frame 320. In other words, the patterning slit sheet frame 320 has an accommodation groove 320a for accommodating the tensile force application unit 330. The accommodation groove 320a is opened towards a top surface of the patterning slit sheet frame 320, i.e., towards the patterning slit sheet 110. The tensile force application unit 330 is disposed inside the accommodation groove 320a, and thus the tensile force application unit 330 may ascend to protrude from the accommodation groove 320a.

The tensile force application unit 330 may provide a tensile force to the patterning slit sheet 110 by protruding and ascending from the accommodation groove 320a of the patterning slit sheet frame 320. For example, the tensile force may be provided to the patterning slit sheet 110 as the tensile force application unit 330 ascends after an outermost side portion of the patterning slit sheet 110 is welded and fixed to the patterning slit sheet frame 320.

Referring to FIG. 8, the tensile force application unit 330 ascends (in the direction indicated by the arrows A) to protrude from the accommodation groove 320a of the patterning slit sheet frame 120 while ascending the outer portion 112 of the patterning slit sheet 110. Since the periphery of the outer portion 112 of the patterning slit sheet 110 is welded and fixed to a top surface of the patterning slit sheet frame 320, when the tensile force application unit 130 ascends as described above, the outer portion 112 of the patterning slit sheet 110 ascends while the periphery of the outer portion 112 of the patterning slit sheet 110 is fixed. Accordingly, the patterning slit sheet 110 drooped due to self-weight may be tightened as the tensile force is applied to the patterning slit sheet 110 in the direction indicated by the arrows B.

Figure 9:
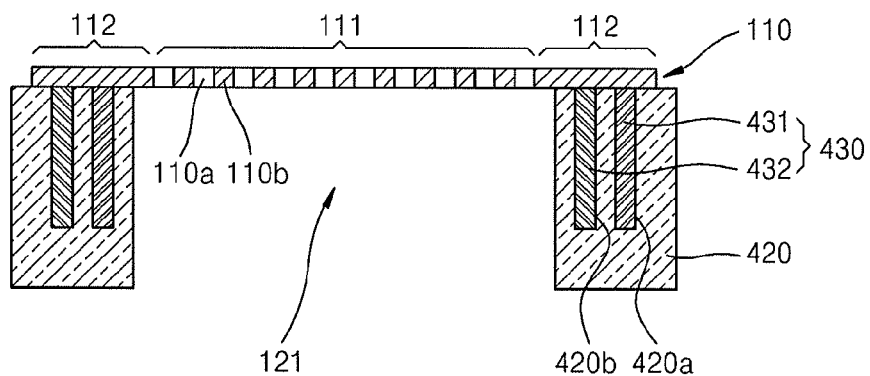
FIG. 9 is a cross-sectional view schematically illustrating a patterning slit sheet frame assembly according to an embodiment.

FIG. 9 is a cross-sectional view schematically illustrating a patterning slit sheet frame assembly 400 according to another embodiment.

Referring to FIG. 9, the patterning slit sheet frame assembly 400 according to the current embodiment is different from the patterning slit sheet frame assembly 300 of FIGS. 6 through 8 in that a tensile force application unit 430 includes a first tensile force application unit 431 and a second tensile force application unit 432, which are respectively accommodated in a first accommodation groove 420*a* and a second accommodation groove 420*b*. Descriptions of components that are the same as those of the patterning slit sheet frame assembly 300 will not be repeated as they have been described above with reference to FIGS. 6 through 8.

A patterning slit sheet frame 420 includes the first accommodation groove 420*a* and the second accommodation groove 420*b*. The first accommodation groove 420*a* is formed farther from a center of the patterning slit sheet 110 than the second accommodation groove 420*b*. The first accommodation groove 420*a* and the second accommodation groove 420*b* are opened towards a top surface of the patterning slit sheet frame 420, i.e., towards the patterning slit sheet 110. The first tensile force application unit 431 may be disposed in the first accommodation groove 420*a* and the second tensile force application unit 432 may be disposed in the second accommodation groove 420*b* such that the first and second tensile force application units 431 and 432 ascend to protrude from the first and second accommodation grooves 420*a* and 420*b*. The first and second tensile force application units 431 and 432 may separately move. For example, the first tensile force application unit 431 may first ascend to apply a tensile force to the patterning slit sheet 110, and then the second tensile force application unit 432 may ascend to apply an additional tensile force to the patterning slit sheet 110.

Figure 10:
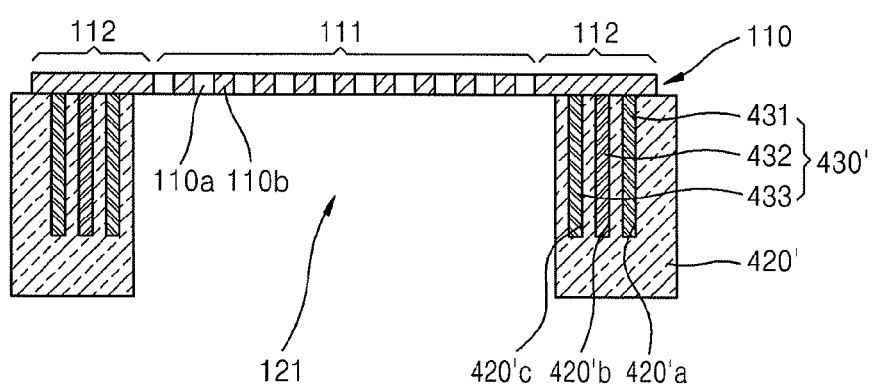
FIG. 10 is a cross-sectional view schematically illustrating a patterning slit sheet frame assembly according to an embodiment.

FIG. 10 is a cross-sectional view schematically illustrating a patterning slit sheet frame assembly 400' according to another embodiment.

Referring to FIG. 10, the patterning slit sheet frame assembly 400' according to the current embodiment is different from the patterning slit sheet frame assembly 300 of FIGS. 6 through 8 in that the tensile force application unit 430 includes the first tensile force application unit 431, the second tensile force application unit 432, and a third tensile force application unit 433, which are respectively accommodated in a first accommodation groove 420'*a*, a second accommodation groove 420'*b*, and a third accommodation groove 420'*c*. Descriptions of components that are the same as those of the patterning slit sheet frame assembly 300 will not be repeated as they have been described above with reference to FIGS. 6 through 8.

A patterning slit sheet frame 420' includes the first accommodation groove 420'*a*, the second accommodation groove 420'*b*, and the third accommodation groove 420'*c*. The first accommodation groove 420'*a* is formed farther from the center of the patterning slit sheet 110 than the second accommodation groove 420'*b*, and the second accommodation groove 420'*b* is formed farther still from the center of the patterning slit sheet 110 than the third accommodation groove 420'*c*. The first accommodation groove 420'*a*, the second accommodation groove 420'*b*, and the third accommodation groove 420'*c* are opened towards the top surface of the patterning slit sheet frame 420, i.e., towards the patterning slit sheet 110. The first tensile force application unit 431 is disposed in the first accommodation groove 420'*a*, the second tensile force application unit 432 is disposed in the second accommodation groove 420'*b*, and the third tensile force application unit 433 is disposed in the third accommodation groove 420'*c*.

The first through third tensile force application units 431 through 433 may ascend to protrude from the first through third accommodation grooves 420'*a* through 420'*c*. The first through third tensile force application units 431 through 433 may separately move. For example, the first tensile force application unit 431 may first ascend to apply a tensile force to the patterning slit sheet 110, and then the second tensile force application unit 432 may ascend to apply an additional tensile force to the patterning slit sheet 110. Also, the third tensile force application unit 433 may ascend to apply an additional tensile force to the patterning slit sheet 110.

The number of tensile force application units is not limited and may be n, wherein n is a natural number. In this case, an (n)th tensile force application unit may be disposed closer to a center of a patterning slit sheet than an (n−1)th tensile force application unit.

Figure 11:
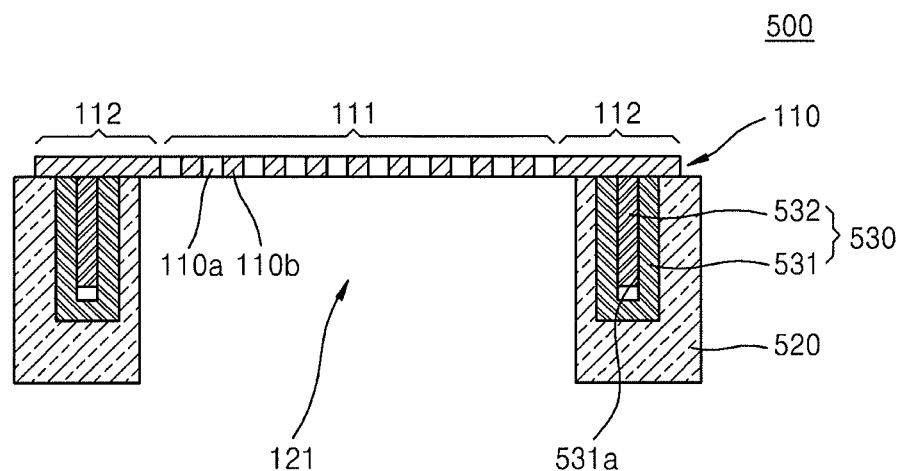
FIG. 11 is a cross-sectional view schematically illustrating a patterning slit sheet frame assembly according to an embodiment.

FIG. 11 is a cross-sectional view schematically illustrating a patterning slit sheet frame assembly 500 according to another embodiment.

Referring to FIG. 11, in the patterning slit sheet frame assembly 500 according to the current embodiment, a plurality of first and second tensile force application units 531 and 532 are disposed in one accommodation groove 520*a*. For example, the first tensile force application unit 531 is disposed in the accommodation groove 520*a* and an accommodation portion 531*a* for accommodating the second tensile force application unit 532 is formed in the first tensile force application unit 531 so that the second tensile force application unit 532 is disposed in the accommodation portion 531*a*.

The first tensile force application unit 531 may ascend to protrude from the accommodation groove 520*a*, and the second tensile force application unit 532 may ascend to protrude from the accommodation portion 531*a*.

A side portion of the patterning slit sheet 110 extending farther than the first tensile force application unit 531 is welded and fixed to a patterning slit sheet frame 520, and thus a tensile force is applied to the patterning slit sheet 110 as the first tensile force application unit 531 ascends and protrudes from the accommodation groove 520*a*. An additional tensile force is applied to the patterning slit sheet 110 as the second tensile force application unit 532 ascends and protrudes from the accommodation portion 531*a*.

Figure 12:
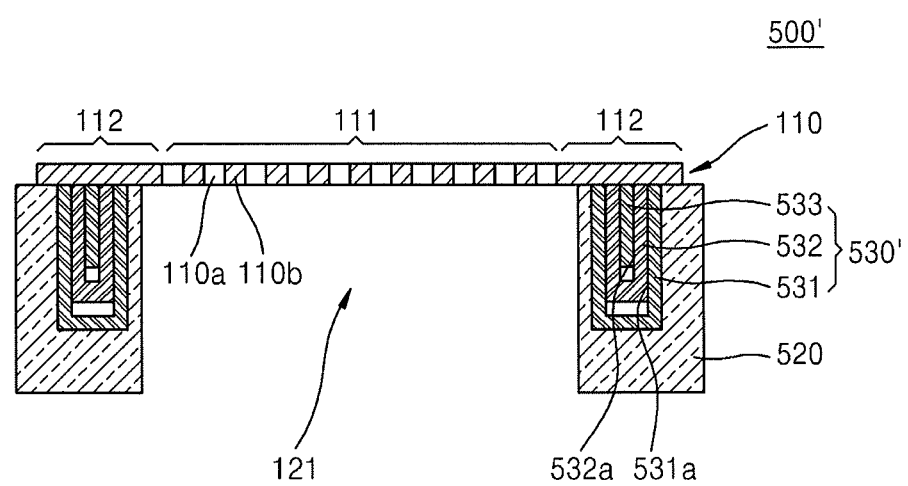
FIG. 12 is a cross-sectional view schematically illustrating a patterning slit sheet frame assembly according to an embodiment.

FIG. 12 is a cross-sectional view schematically illustrating a patterning slit sheet frame assembly 500' according to another embodiment.

The patterning slit sheet frame assembly 500' of FIG. 12 is different from the patterning slit sheet frame assembly 500 of FIG. 11 as there are three tensile force application units 530'.

For example, in the patterning slit sheet frame assembly 500', the first tensile force application unit 531 is disposed in the accommodation groove 520*a*, the accommodation portion 531*a* for accommodating the second tensile force application unit 532 is formed in a groove within the first tensile force application unit 531, and an accommodation portion 532*a* for accommodating a third tensile force application unit 533 is formed within a groove in the second tensile force application unit 532. Accordingly, the second tensile force application unit 532 is disposed in the accommodation portion 531*a* and the third tensile force application unit 533 is disposed on the accommodation portion 532*a*.

The first tensile force application unit 531 may ascend to protrude from the accommodation groove 520*a*, the second tensile force application unit 532 may ascend to protrude from the accommodation portion 531*a*, and the third tensile force application unit 533 may ascend to protrude from the accommodation portion 532*a*.

Since the side portion of the patterning slit sheet 110 extending farther than the first tensile force application unit 531 is welded and fixed to the patterning slit sheet frame 520, a tensile force is applied to the patterning slit sheet 110 as the first tensile force application unit 531 ascends and protrudes from the accommodation groove 520*a* and an additional tensile force is applied to the patterning slit sheet 110 as the second tensile force application unit 532 ascends and protrudes from the accommodation portion 531*a*. Also, an additional tensile force is applied to the patterning slit sheet 110 as the third tensile force application unit 533 ascends and protrudes from the accommodation portion 532a.

Figure 13:
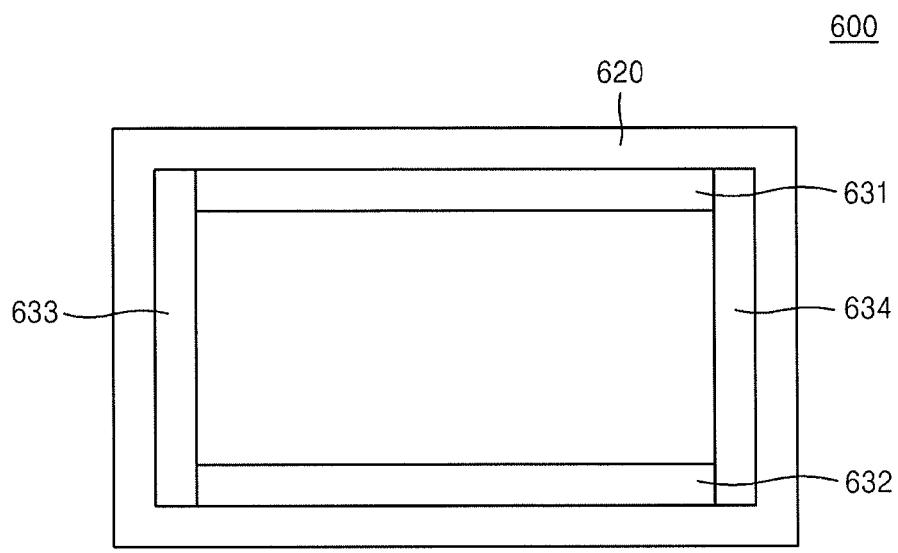
FIG. 13 is a plan view schematically illustrating a patterning slit sheet frame assembly according to an embodiment.

FIG. 13 is a plan view schematically illustrating a patterning slit sheet frame assembly 600 according to another embodiment.

In the patterning slit sheet frame assembly 600 of FIG. 13, a plurality of first through fourth tensile force application units 631, 632, 633, and 634 are disposed on an inner surface of a patterning slit sheet frame 620. In other words, the first and second tensile force application units 631 and 632 are respectively disposed on long facing sides of the inner surface of the patterning slit sheet frame 620, and the third and fourth tensile force application units 633 and 634 are respectively disposed on short facing sides of the inner surface of the patterning slit sheet frame 620. The first through fourth tensile force application units 631 through 634 may separately or simultaneously ascend along the inner surface of the patterning slit sheet frame 620. Different tensile forces may be applied to the top, bottom, right, and left of a patterning slit sheet as the first through fourth tensile force application units 631 through 634 separately ascend, and thus the patterning slit sheet may be more precisely controlled.

Figure 14:
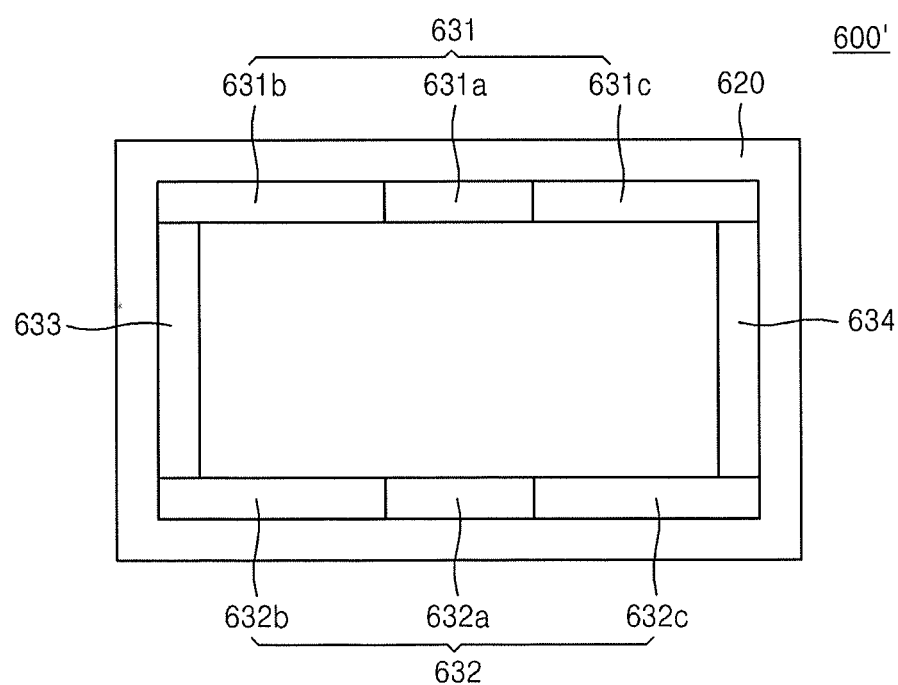
FIG. 14 is a plan view schematically illustrating a patterning slit sheet frame assembly according to an embodiment.

FIG. 14 is a plan view schematically illustrating a patterning slit sheet frame assembly 600' according to another embodiment.

The patterning slit sheet frame assembly 600' of FIG. 14 is different from the patterning slit sheet frame assembly 600 of FIG. 13 as the first and second tensile force application units 631 and 632 respectively include a plurality of first through sixth tensile force application members 631a, 631b, and 631c, and 632a, 632b, and 632c.

Referring to FIG. 14, the first and second tensile force application units 631 and 632 are disposed on an inner surface of the patterning slit sheet frame 620 while facing each other. The first tensile force application unit 631 includes the first through third tensile force application members 631a through 631c and the second tensile force application unit 632 includes the fourth through sixth tensile force application members 632a through 632c. The first through sixth tensile force application members 631a through 631c and 632a through 632c may separately ascend to each supply a tensile force to a patterning slit sheet.

Figure 15:
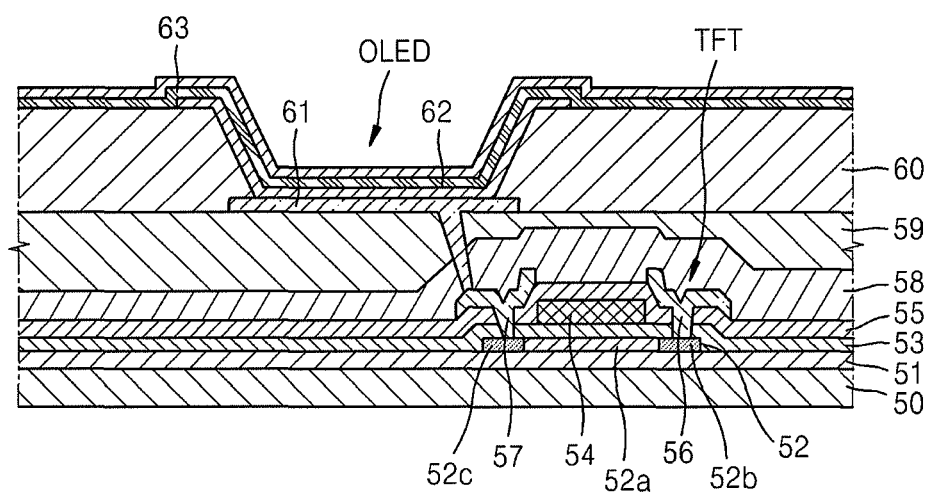
FIG. 15 is a cross-sectional view schematically illustrating an organic light emitting display apparatus manufactured by using a patterning slit sheet frame assembly, according to an embodiment.

FIG. 15 is a cross-sectional view schematically illustrating an organic light emitting display apparatus manufactured by using a patterning slit sheet frame assembly, according to an embodiment.

Referring to FIG. 15, the organic light emitting display apparatus is an active matrix type and is formed on a substrate 50. The substrate 50 may be formed of a transparent material, such as a glass material, a plastic material, or a metal material. An insulating film 51, such as a buffer layer, is formed throughout on the substrate 50.

A thin film transistor (TFT) and an organic light emitting device (OLED) are formed on the insulating film 51 as shown in FIG. 15. Here, the organic light emitting device may be regarded as an organic light emitting diode, if necessary.

A semiconductor active layer 52 having a predetermined pattern is formed on a top surface of the insulating film 51. The semiconductor active layer 52 is embedded by a gate insulating film 53. The semiconductor active layer 52 may include a p- or n-type semiconductor.

A gate electrode 54 of the TFT is formed at a location of the top surface of the gate insulating film 53 corresponding to the semiconductor active layer 52. Also, an interlayer insulating film 55 is formed to cover the gate electrode 54. After the interlayer insulating film 55 is formed, a contact hole is formed by etching the gate insulating film 53 and the interlayer insulating film 55 via an etching process, such as dry etching, to expose some of the semiconductor active layer 52.

Then, source and drain electrodes 56 and 57 are formed on the interlayer insulating film 55 to contact the semiconductor active layer 52 exposed through the contact hole. A passivation film 58 is formed to cover the source and drain electrodes 56 and 57, and some of the drain electrode 57 is exposed through an etching process. An individual insulating film 59 may be further formed on the passivation film 58 to planarize the passivation film 58.

The OLED may be used to display predetermined image information by emitting red, green, and blue lights according to a flow of current, in which a first electrode 61 is formed on the passivation film 58. The first electrode 61 is electrically connected to the drain electrode 57 of the TFT.

Then, a pixel-defining film 60 is formed to cover the first electrode 61. After a predetermined opening is formed on the pixel-defining film 60, an organic layer 63 including an emission layer is formed in a region limited by the predetermined opening. Also, a second electrode 62 is formed on the organic layer 63.

The pixel-defining film 60 defines pixels, is formed of an organic material, and planarizes a surface of the substrate 50 where the first electrode 61 is formed, specifically, a surface of the individual insulating film 59.

The first and second electrodes 61 and 62 are insulated from each other, and apply voltages of different polarities to the organic layer 63 including the emission layer for light emission.

The organic layer 63 including the emission layer may be formed of a low molecular weight organic material or a high molecular weight organic material. When the low molecular weight organic material is used, a hole injection layer (HIL), a hole transport layer (HTL), an emission layer (EML), an electron transport layer (ETL), and an electron injection layer (EIL) may be stacked in a single or complex structure. Also, various organic materials may be used, such as copper phthalocyanine (CuPc), N,N'-Di(naphthalene-1-yl)-N,N'-diphenyl-benzidine (NPB), and tris-8-hydroxyquinoline aluminum (Alq3).

For example, the organic layer 63 including the emission layer may be deposited through the patterning slit sheet frame assembly 100 of FIG. 1. In other words, in an organic layer depositing apparatus including a deposition source radiating a deposition material, a patterning slit sheet facing the deposition source and including a plurality of patterning slits, and a patterning slit sheet frame, the deposition material radiated from the deposition source may pass through the patterning slit of the patterning slit sheet and be deposited on a target substrate after the target substrate is closely disposed to the patterning slit sheet. After forming an organic emission film as such, the second electrode 62 may also be formed via the same deposition process.

The first electrode 61 may operate as an anode and the second electrode 62 may operate as a cathode, or vice versa. The first electrode 61 may be patterned to correspond to a region of each pixel, and the second electrode 62 may be formed to cover all pixels.

The first electrode 61 may be a transparent or reflective electrode. When the first electrode 61 is used as a transparent electrode, indium tin oxide (ITO), indium zinc oxide (IZO), zinc oxide (ZnO), or indium oxide ($In_2O_3$) may be used. When the first electrode 61 is used as a reflective electrode, a reflective layer may be formed by using silver (Ag), magnesium (Mg), aluminum (Al), platinum (Pt), palladium (Pd), gold (Au), nickel (Ni), neodymium (Nd), iridium (Ir), chromium (Cr), or a compound thereof, and then a transparent electrode layer may be formed on the reflective layer by using ITO, IZO, ZnO, or $In_2O_3$. The first electrode 61 may be formed via a sputtering method and then patterned via a photolithography method.

The second electrode 62 may also be a transparent or reflective electrode. When the second electrode 62 is used as a transparent electrode, the second electrode 62 is used as a cathode, and thus a metal having a low work function, such as lithium (Li), calcium (Ca), lithium fluoride (LiF)/Ca, LiF/Al, Al, Ag, Mg, or a compound thereof, may be deposited to face a direction of the organic layer 63 including the emission layer. Then an auxiliary electrode layer or a bus electrode line may be formed on the metal by using ITO, IZO, ZnO, or $In_2O_3$. According to another exemplary embodiment, when the second electrode 62 is used as a reflective electrode, Li, Ca, LiF/Ca, LiF/Al, Al, Ag, Mg, or a compound thereof may be deposited throughout an active area including a plurality of pixels. For example, the deposition may be performed in the same manner as in the organic layer 63 including the emission layer.

The patterning slit sheet frame assembly may also be used to deposit an organic or inorganic film or an organic TFT, and may be used to form a film of any one of various materials.

By way of summation and review, organic light emitting display apparatuses realize colors according to a principle that light is emitted as holes and electrons injected into an anode and a cathode recombine in an emission layer. This principle may be realized by a stacked structure where the emission layer is inserted between the anode and the cathode. Further, since it could be difficult to obtain highly efficient light emission in the stacked structure, an intermediate layer, such as at least one of an electron injection layer (EIL), an electron transport layer (ETL), a hole transport layer (HTL), and a hole injection layer (HIL), may be selectively additionally inserted between each electrode and the emission layer.

The electrodes of the organic light emitting display apparatus and the intermediate layers including the emission layer may be formed via any one of various methods, such as a deposition method. To manufacture the organic light emitting display apparatus by using the deposition method, a fine metal patterning slit sheet (e.g., fine metal mask (FMM)) having a same pattern as a thin film to be formed on a substrate may be arranged, and a thin film having the desired pattern is formed by depositing a raw material of the thin film.

Embodiments relate to a patterning slit sheet frame assembly. For example, embodiments relate to a patterning slit sheet frame assembly capable of applying a tensile force to a patterning slit sheet even after the patterning slit sheet is adhered to a patterning slit sheet frame.

According to the one or more embodiments, the tensile force is applied to the patterning slit sheet even after the patterning slit sheet is adhered to the patterning slit sheet frame, and thus the sizes and uniformity of opening portions of the patterning slit sheet and pixel position accuracy (PPA) may be minutely adjusted, and the patterning slit sheet may be protected and/or prevented from drooping.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method for manufacturing an organic light-emitting display apparatus, the method comprising:
   forming a first electrode;
   forming an organic layer on the first electrode by depositing organic material through a patterning slit sheet frame assembly, the patterning slit sheet frame assembly including:
   a patterning slit sheet having a pattern;
   a patterning slit sheet frame supporting the patterning slit sheet; and
   a tensile force application unit that applies a tensile force to the patterning slit sheet after the patterning slit sheet is disposed on the patterning slit sheet frame, the tensile force application unit being entirely on an inner side of the patterning slit sheet frame; and
   forming a second electrode so that the organic layer is interposed between the first electrode and the second electrode.

2. A method for manufacturing an organic light-emitting display apparatus, the method, comprising:
   forming a first electrode;
   forming an organic layer on the first electrode by depositing organic material through a patterning slit sheet frame assembly, the patterning slit sheet frame assembly including:
   a patterning slit sheet having a pattern;
   a patterning slit sheet frame supporting the patterning slit sheet; and
   a tensile force application unit that applies a tensile force to the patterning slit sheet after the patterning slit sheet is disposed on the patterning slit sheet frame,
   wherein an entirety of the tensile force application unit is closer to a center portion of the patterning slit sheet than is a location where the patterning slit sheet and the patterning slit sheet frame are attached to each other; and
   forming a second electrode so that the organic layer is interposed between the first electrode and the second electrode.

3. The method of claim 1, wherein the tensile force application unit applies force to the patterning slit sheet only in a direction orthogonal to which tensile force is applied to the patterning slit sheet, while the patterning slit sheet and the patterning slit sheet frame are connected to each other.

4. The method of claim 1, wherein the patterning slit sheet includes a center portion where a patterning slit is formed and an outer portion where the pattern is excluded.

5. The method of claim 4, wherein the tensile force application unit contacts the outer portion to surround the center portion of the patterning slit sheet.

6. The method of claim 4, wherein the patterning slit sheet frame has a pillar shape having a penetrating portion corresponding to the center portion.

7. The method of claim 6, wherein a top surface of the patterning slit sheet frame is connected to the outer portion and the center portion is exposed by the penetrating portion.

8. The method of claim 6, wherein the tensile force application unit is on an inner surface of the patterning slit sheet frame and a top surface of the tensile force application unit contacts the outer portion.

9. The method of claim 8, wherein the tensile force application unit is movable only in directions orthogonal to which tensile force is applied to the patterning slit sheet.

10. The method of claim 9, wherein the tensile force application unit applies the tensile force to the patterning slit sheet by applying force to the patterning slit sheet only in a direction orthogonal to which tensile force is applied to the patterning slit sheet.

11. The method of claim 8, wherein:
    there are n tensile force application units, where n is a natural number, and
    an (n)th tensile force application unit is on an inner surface of an (n−1)th tensile force application unit.

12. The method of claim 8, wherein the tensile force application unit is formed separately on the inner surface of the patterning slit sheet frame.

13. The method of claim 6, wherein the patterning slit sheet frame includes an accommodation groove that accommodates the tensile force application unit therein.

14. The method of claim 13, wherein the tensile force application unit is inside the accommodation groove and the accommodation groove is covered by the outer portion.

15. The method of claim 14, wherein:
    the tensile force application unit is movable only in directions orthogonal to which tensile force is applied to the patterning slit sheet inside the accommodation groove, and
    the tensile force is applied to tighten the patterning slit sheet as the tensile force application unit protrudes outside the accommodation groove and applies force to the patterning slit sheet only in a direction orthogonal to which tensile force is applied to the patterning slit sheet.

16. The method of claim 13, wherein there is a plurality of the accommodation grooves and the tensile force application unit is within each of the plurality of accommodation grooves.

17. The method of claim 16, wherein the plurality of accommodation grooves are spaced apart from each other in a receding direction from a center point of the patterning slit sheet.

18. The method of claim 13, wherein there is a plurality of the tensile force application units, and each of the plurality of tensile force application units comprises an accommodation portion for accommodating the other tensile force application unit.

19. The method of claim 18, wherein:
    there are n tensile force application units, wherein n is a natural number, and
    a first tensile force application unit is accommodated in the accommodation groove, a second tensile force application unit is accommodated in an accommodation portion of the first tensile force application unit, and a (n)th tensile force application unit is accommodated in an accommodation portion of a (n−1)th tensile force application unit.

* * * * *